United States Patent
Kato et al.

(10) Patent No.: US 8,552,405 B2
(45) Date of Patent: Oct. 8, 2013

(54) CHARGED PARTICLE BEAM WRITING APPARATUS AND CHARGED PARTICLE BEAM WRITING METHOD

(71) Applicant: NuFlare Technology, Inc., Numazu, PA (US)

(72) Inventors: Yasuo Kato, Kanagawa (JP); Jun Yashima, Kanagawa (JP)

(73) Assignee: NuFlare Technology, Inc., Numazu-shi (JP)

(*) Notice: Subject to any disclaimer, the term of this patent is extended or adjusted under 35 U.S.C. 154(b) by 0 days.

(21) Appl. No.: 13/647,665

(22) Filed: Oct. 9, 2012

(65) Prior Publication Data
US 2013/0099139 A1    Apr. 25, 2013

(30) Foreign Application Priority Data
Oct. 20, 2011   (JP) .................... 2011-230464

(51) Int. Cl.
*H01J 3/14* (2006.01)
*G21K 5/10* (2006.01)
*G03C 5/00* (2006.01)

(52) U.S. Cl.
USPC ........... 250/492.22; 250/492.2; 250/492.3; 250/492.1; 250/397; 250/396 R; 430/296; 716/53

(58) Field of Classification Search
USPC ......... 250/492.22, 492.1, 492, 2, 492.3, 397, 250/396 R; 430/296; 716/53
See application file for complete search history.

(56) References Cited

U.S. PATENT DOCUMENTS

| | | | |
|---|---|---|---|
| 5,863,682 A | 1/1999 | Abe et al. | |
| 7,375,356 B2 | 5/2008 | Kurokawa | |
| 7,608,845 B2 * | 10/2009 | Abe et al. | 250/492.22 |
| 7,669,174 B2 * | 2/2010 | Emi et al. | 716/53 |
| 8,309,283 B2 * | 11/2012 | Kato et al. | 430/30 |
| 2007/0114453 A1 | 5/2007 | Emi et al. | |
| 2011/0253911 A1 * | 10/2011 | Matsumoto | 250/492.3 |
| 2012/0126145 A1 | 5/2012 | Yashima | |

FOREIGN PATENT DOCUMENTS

| | | |
|---|---|---|
| JP | 3469422 | 9/2003 |
| JP | 3655622 | 3/2005 |
| JP | 2007-150243 | 6/2007 |
| JP | 4621076 | 11/2010 |
| JP | 2012-114105 | 6/2012 |
| JP | 2012-212792 | 11/2012 |

OTHER PUBLICATIONS

U.S. Appl. No. 13/765,140, filed Feb. 12, 2013, Kato, et al.

* cited by examiner

*Primary Examiner* — Nikita Wells
(74) *Attorney, Agent, or Firm* — Oblon, Spivak, McClelland, Maier & Neustadt, L.L.P.

(57) ABSTRACT

A charged particle beam writing apparatus includes a unit to calculate a gradient of a convolution amount that is calculated from a convolution operation between an area density and a distribution function, a unit to calculate a small influence radius phenomenon dose correction coefficient that corrects for dimension variation due to a phenomenon whose influence radius is on an order of microns or less, by using the convolution amount and the gradient, a unit to calculate a proximity effect dose correction coefficient that corrects for dimension variation due to a proximity effect, by using a first function depending on the small influence radius phenomenon dose correction coefficient, a unit to calculate a dose by using the proximity effect dose correction coefficient and the small influence radius phenomenon dose correction coefficient, and a unit to write a figure pattern concerned on a target object, based on the dose.

15 Claims, 10 Drawing Sheets

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from the prior Japanese Patent Application No. 2011-230464 filed on Oct. 20, 2011 in Japan, the entire contents of which are incorporated herein by reference.

BACKGROUND OF THE INVENTION

1. Field of the Invention

The present invention relates to a charged particle beam writing apparatus and a charged particle beam writing method. For example, in electron beam writing, the present invention relates to a method of correcting for pattern dimension variation due to a phenomenon whose influence radius is less than that of a proximity effect, like the case of extreme ultraviolet (EUV) short range proximity effect correction (PEC).

2. Description of Related Art

The lithography technique that advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. In order to form a desired circuit pattern on semiconductor devices, a master or "original" pattern (also called a mask or a reticle) of high precision is needed. Thus, the electron beam (EB) writing technique, which intrinsically has excellent resolution, is used for producing such a highly precise master pattern.

FIG. 10 is a schematic diagram explaining operations of a variable shaped electron beam writing apparatus. As shown in the figure, the variable shaped electron beam writing apparatus operates as described below. A first aperture plate 410 has a quadrangular opening 411 for shaping an electron beam 330. A second aperture plate 420 has a variable-shape opening 421 for shaping the electron beam 330 having passed through the opening 411 of the first aperture plate 410 into a desired quadrangular shape. The electron beam 330 emitted from a charged particle source 430 and having passed through the opening 411 is deflected by a deflector to pass through a part of the variable-shape opening 421 of the second aperture plate 420, and thereby to irradiate a target object or "sample" 340 placed on a stage which continuously moves in one predetermined direction (e.g. x direction) during the writing. In other words, a quadrangular shape that can pass through both the opening 411 and the variable-shape opening 421 is used for pattern writing in a writing region of the target object 340 on the stage continuously moving in the x direction. This method of forming a given shape by letting beams pass through both the opening 411 of the first aperture plate 410 and the variable-shape opening 421 of the second aperture plate 420 is referred to as a variable shaped beam (VSB) method.

In the above-described electron beam writing, highly precise uniformity of the line width is required on the surface of a target object, such as a mask surface, when writing a pattern on the target object. However, in the electron beam writing, a phenomenon called a proximity effect occurs when electron beams irradiate a circuit pattern on a mask with resist to write a pattern. The proximity effect is generated by the backward scattering of electron beams penetrating the resist film, reaching the layer thereunder to be reflected, and entering the resist film again. As a result, a dimension change occurs, thereby causing a written pattern deviated from a desired one in dimension. On the other hand, when developing or etching after writing a pattern, a dimension change called a loading effect due to density difference of a circuit pattern occurs.

Here, there is a proximity effect correction coefficient η which is suitable for performing proximity effect correction, for each base dose $D_{base}$. Then, a method of calculating a dose for correcting a dimension variation amount due to a loading effect while correcting a proximity effect along with changing a combination of the base dose $D_{base}$ and the proximity effect correction coefficient η is disclosed (refer to, e.g., Japanese Patent Application Laid-open (JP-A) No. 2007-150243).

However, with the recent miniaturization of patterns, it has turned out that an error occurs in a conventional dose calculation model in accordance with downsizing of a pattern to be written. For example, it has turned out that an error occurs in a conventional dose calculation model with respect to a phenomenon whose influence radius is several μm or less, like the case of EUV short range proximity effect (short range PEC). The influence radius of such phenomenon is less than that of the proximity effect described above.

If calculating a dose including such deviation all from the start, the time for processing will be very long since all the writing regions need to be calculated in a unit of a small region. Therefore, for example, it can be considered to calculate an amount of correction in advance at the outside before performing writing and to define the calculated correction amount as additional data of layout data to be input into a writing apparatus. However, there is a problem that such a method cannot be used when needing to change the parameter for correction calculation. Thus, although it is desirable to perform correction calculation more simply in a writing apparatus, an adequate method for solving the problem described above has not been established yet.

BRIEF SUMMARY OF THE INVENTION

In accordance with one aspect of the present invention, a charged particle beam writing apparatus includes a gradient calculation unit configured to calculate a gradient of a convolution amount that is calculated from a convolution operation between an area density and a distribution function; a small influence radius phenomenon dose correction coefficient calculation unit configured to calculate a small influence radius phenomenon dose correction coefficient that corrects for dimension variation due to a phenomenon whose influence radius is on an order of microns or less, by using the convolution amount and the gradient; a first proximity effect dose correction coefficient calculation unit configured to calculate a first proximity effect dose correction coefficient that corrects for dimension variation due to a proximity effect, by using a first function depending on the small influence radius phenomenon dose correction coefficient; a dose calculation unit configured to calculate a dose by using the first proximity effect dose correction coefficient and the small influence radius phenomenon dose correction coefficient; and a writing unit configured to write a figure pattern concerned on a target object, based on the dose, by using a charged particle beam.

In accordance with another aspect of the present invention, a charged particle beam writing method includes calculating a gradient of a convolution amount that is calculated from a convolution operation between an area density and a distribution function; calculating a small influence radius phenomenon dose correction coefficient that corrects for dimension variation due to a phenomenon whose influence radius is on an order of microns or less, by using the convolution amount and the gradient; calculating a first proximity effect dose correction coefficient that corrects for dimension variation due to a proximity effect, by using a first function depending on the small influence radius phenomenon dose correction coefficient; calculating a dose by using the first proximity effect dose correction coefficient and the small influence radius phenomenon dose correction coefficient; and writing a figure pattern concerned on a target object, based on the dose, by using a charged particle beam.

DETAILED DESCRIPTION OF THE INVENTION

In the following Embodiments, there will be described a structure in which an electron beam is used as an example of a charged particle beam. The charged particle beam is not limited to the electron beam, and other charged particle beam, such as an ion beam, may also be used. Moreover, a variable-shaped electron beam writing apparatus will be described as an example of a charged particle beam apparatus. Moreover, in the equation etc. described below, x is a vector indicating a position.

In the following Embodiments, there will be described an apparatus and a method thereof that can correct for pattern dimension variation due to a phenomenon whose influence radius is several μm or less while correcting for dimension variation due to other variation factors.

Embodiment 1

Figure 1:
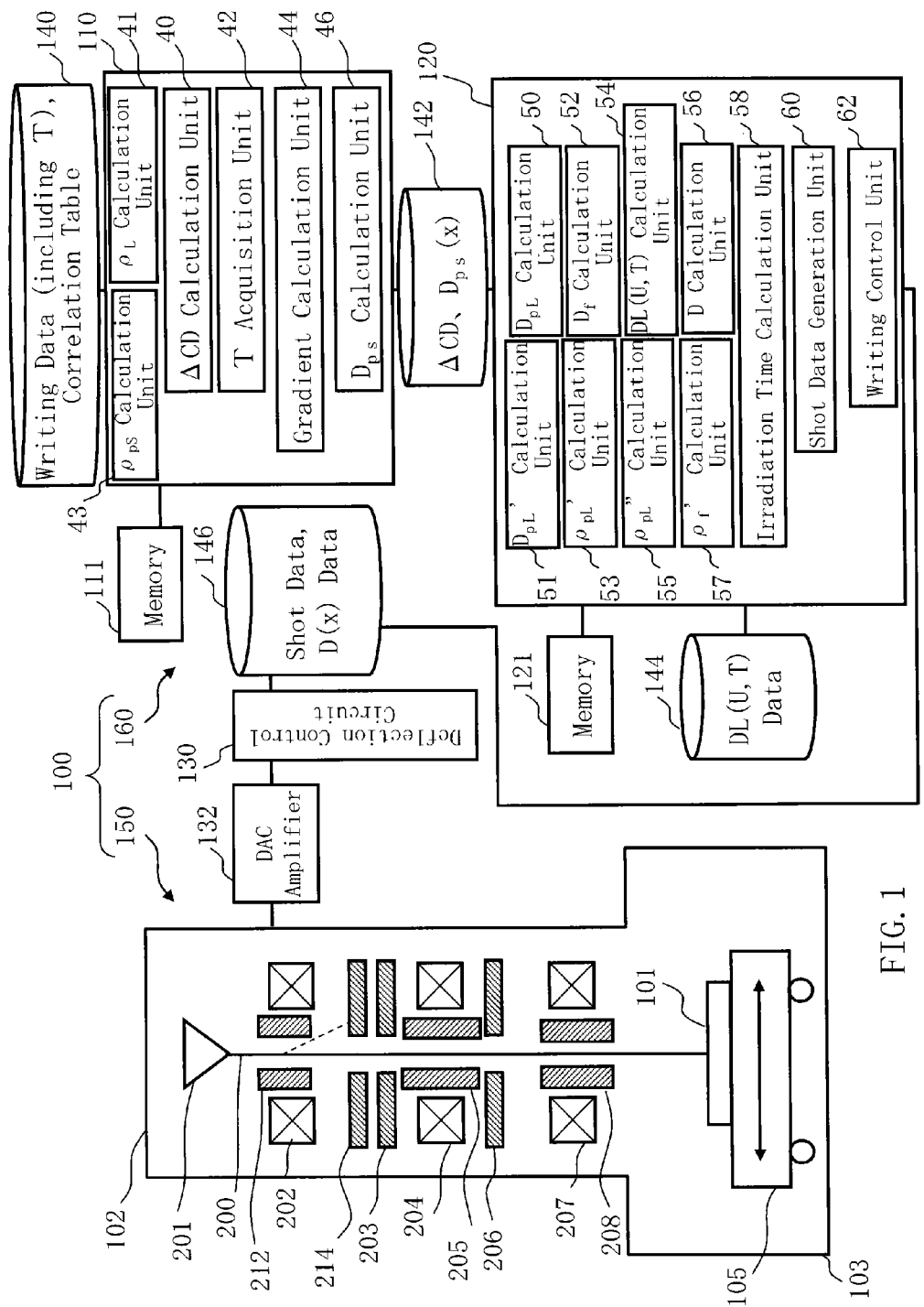
FIG. 1 is a schematic diagram showing a configuration of a writing apparatus according to Embodiment 1.

FIG. 1 is a schematic diagram showing a configuration of a writing apparatus according to Embodiment 1. In FIG. 1, a writing apparatus 100 includes a writing unit 150 and a control unit 160. The writing apparatus 100 (or drawing apparatus 100) is an example of a charged particle beam writing apparatus, and especially, an example of a variable-shaped beam (VSB) writing apparatus. The writing unit 150 includes an electron lens barrel 102 and a writing chamber 103. In the electron lens barrel 102, there are arranged an electron gun assembly 201, an illumination lens 202, a blanking deflector 212, a blanking aperture 214, a first shaping aperture 203, a projection lens 204, a deflector 205, a second shaping aperture 206, an objective lens 207, and a deflector 208. In the writing chamber 103, there is arranged an XY stage 105 movable at least in the x and y directions. On the XY stage 105, there is placed a target object 101 or "sample" serving as a writing target. The target object 101 is, for example, an exposure mask, a silicon wafer, etc. used for manufacturing semiconductor devices. The mask is, for example, a mask blank where no patterns are formed.

The controlling unit 160 includes control computers 110 and 120, memories 111 and 121, a deflection control circuit 130, a digital-to-analog converter (DAC) amplifier 132, and storage devices 140, 142, 144, and 146 such as a magnetic disk drive. The control computers 110 and 120, the memories 111 and 121, the deflection control circuit 130, and the storage devices 140, 142, 144, and 146 are mutually connected through a bus (not shown). The deflection control circuit 130 is connected to the blanking deflector 212 through the DAC amplifier 132.

In the control computer 110, there are arranged a dimension variation amount $\Delta CD$ calculation unit 40, an area density $\rho_L$ calculation unit 41, an area density $\rho_{pS}$ calculation unit 43, a convolution amount T acquisition unit 42, a gradient calculation unit 44, and a dose correction coefficient $D_{ps}$ calculation unit 46 for correcting a dose so that a dimension variation generated by a small influence radius phenomenon may be corrected. Each function, such as the dimension variation amount $\Delta CD$ calculation unit 40, the area density $\rho_L$ calculation unit 41, the area density $\rho_{pS}$ calculation unit 43, the convolution amount T acquisition unit 42, the gradient calculation unit 44, and the dose correction coefficient $D_{ps}$ calculation unit 46 for correcting a dose so that a dimension variation generated by a small influence radius phenomenon can be corrected, may be configured by software such as a program, or may be configured by hardware such as an electronic circuit. Alternatively, it may be configured by a combination of software and hardware. Input data necessary for the control computer 110 and a calculated result are stored in the memory 111 each time.

In the control computer 120, there are arranged a proximity effect dose correction coefficient $D_{pL}$ calculation unit 50, a proximity effect dose correction coefficient $D_{pL}'$ calculation unit 51, a dose density $\rho_{pL}'$ calculation unit 53, a dose density $\rho_{pL}''$ calculation unit 55, a dose density $\rho_f'$ calculation unit 57, a fogging effect dose correction coefficient $D_f$ calculation unit 52, a dose latitude DL(U,T) calculation unit 54, a dose D calculation unit 56, an irradiation time (t) calculation unit 58, a shot data generation unit 60, and a writing control unit 62. Each function, such as the proximity effect dose correction coefficient $D_{pL}$ calculation unit 50, the proximity effect dose correction coefficient $D_{pL}'$ calculation unit 51, the dose density $\rho_{pL}'$ calculation unit 53, the dose density $\rho_{pL}''$ calculation unit 55, the dose density $\rho_f'$ calculation unit 57, the fogging effect dose correction coefficient $D_f$ calculation unit 52, the dose latitude DL(U,T) calculation unit 54, the dose D calculation unit 56, the irradiation time (t) calculation unit 58, the shot data generation unit 60, and the writing control unit 62 may be configured by software such as a program, or may be configured by hardware such as an electronic circuit. Alternatively, it may be configured by a combination of software and hardware. Input data necessary for the control computer 120 and a calculated result are stored in the memory 121 each time.

As described above, FIG. 1 shows a structure necessary for explaining Embodiment 1. Other structure elements generally necessary for the writing apparatus 100 may also be included. For example, although the deflector 208 of a single stage deflector is used for object deflection in this case, a multiple stage deflector of a plurality of stages may also be used. For example, a two stage deflector of the main deflector and the sub deflector may also be used. Alternatively, it is also acceptable to use a three stage deflector of the first objective deflector, the second objective deflector, and the third objective deflector. The deflection control circuit 130 is connected to the deflector 205 and the deflector 208 through each DAC amplifier (not shown).

In the storage device 140, there is stored writing data of each figure data input from the outside, wherein a figure code, coordinates of a reference position, figure dimensions in the x and y directions, and a convolution amount T are defined for each figure. For example, when a pattern is divided into a plurality of figures by performing fracture processing for a pattern after OPC processing, a convolution amount T (x, y) is defined as attribute data for each figure configuring a pattern composed of a plurality of figures connected with each other.

Figure 2:
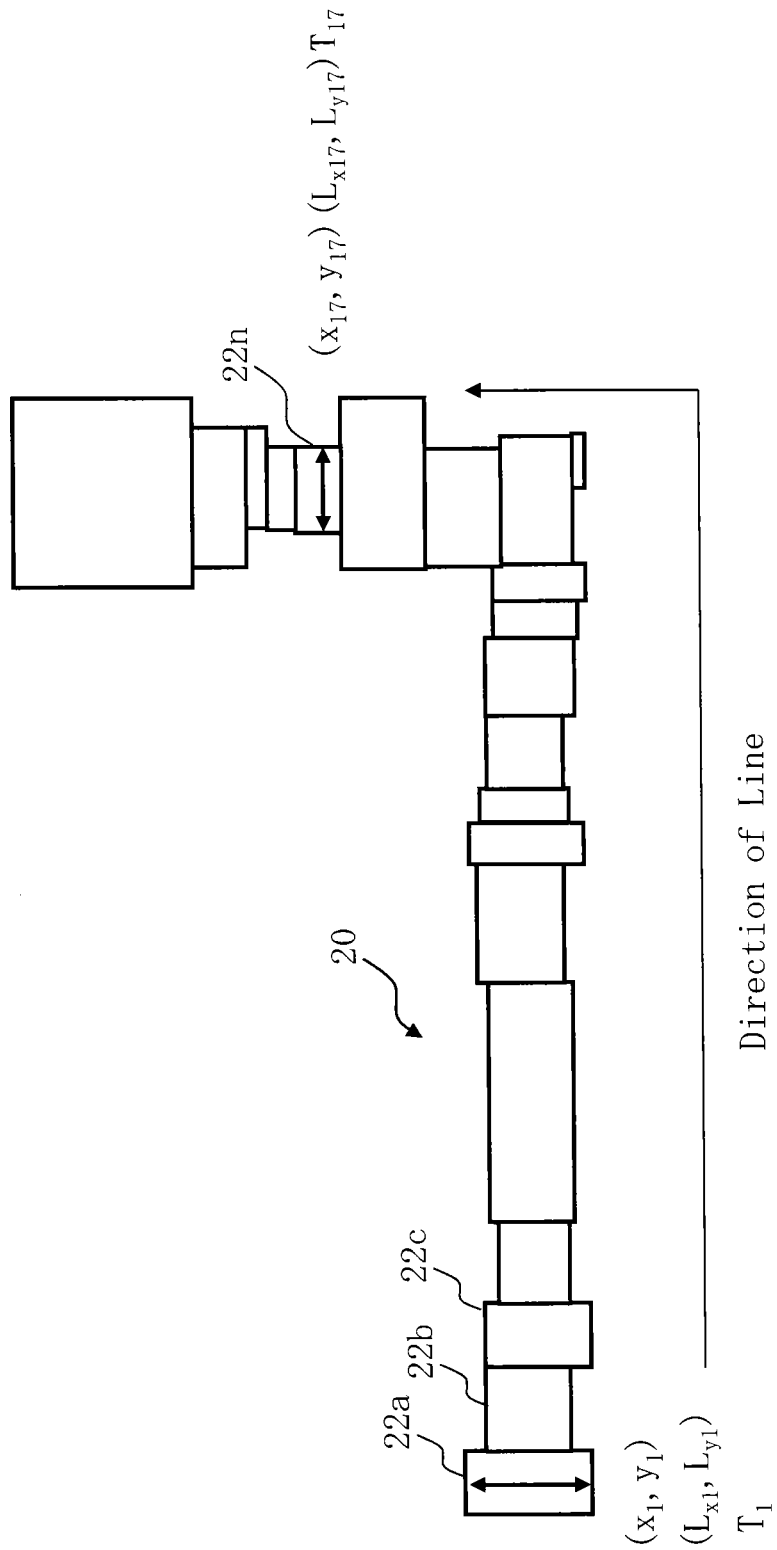
FIG. 2 shows an example of a plurality of figures which configure a pattern according to Embodiment 1.

FIG. 2 shows an example of a plurality of figures which configure a pattern according to Embodiment 1. An example of what is called a letter "L" pattern, extending with changing the line width, is shown as a pattern 20 in FIG. 2. The pattern 20 is divided into a plurality of FIGS. 22a, 22b, 22c, ... 22n by fracture processing before inputting data into the writing apparatus 100. According to Embodiment 1, a parameter for correction operation is defined as attribute data for each FIG. 22 in order to increase the speed of correction calculation processing in the writing apparatus. In FIG. 2, for example, coordinates (x1,y1), figure dimensions (Lx1,Ly1), and a convolution amount T1 are defined with respect to the divided FIG. 22a. Similar definition is provided for other FIGS. 22b, 22c, ... 22n. For example, with respect to the divided FIG. 22n, coordinates (x17,y17), figure dimensions (Lx17,Ly17), and, further, a convolution amount T17 are defined.

Figure 3:
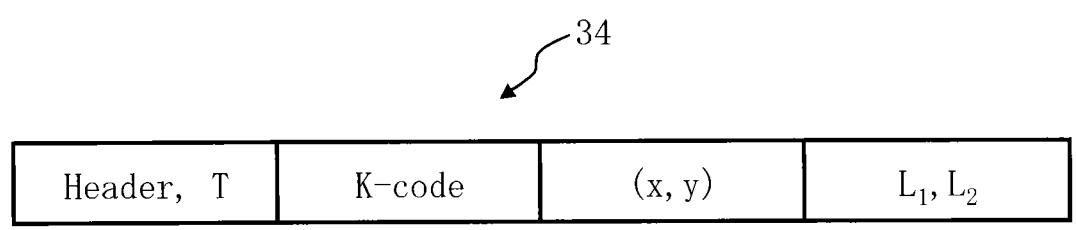
FIG. 3 shows an example of a format of writing data for each figure according to Embodiment 1.

FIG. 3 shows an example of a format of writing data for each figure according to Embodiment 1. In FIG. 3, in writing data 34 to be input into the writing apparatus 100, a header, a figure code (k-code), arrangement coordinates (x,y), and figure dimensions (L1,L2) are defined for each figure, and, further, a convolution amount T is defined as attribute data of the header.

According to Embodiment 1, a correction coefficient is calculated by using the convolution amount T. The convolution amount T does not change even when writing conditions are changed in the writing apparatus 100. For example, the method of calculating a correction amount before writing and defining the calculated correction amount as attribute data of input data is not able to be used when writing conditions are changed. By contrast, the convolution amount T according to Embodiment 1 does not change even when writing conditions are changed, thereby avoiding a defect of becoming unusable when writing conditions are changed. The convolution amount T is defined for each figure as a value obtained by convolving an area density $\rho_{PS}(x)$ of a figure concerned in a predetermined mesh region, and a predetermined distribution function $g_{PS}(x)$. Thus the convolution amount T is calculated from a convolution operation between an area density and a distribution function. The convolution amount T(x) is calculated when fracture processing is performed, for example, and the calculated convolution amount T(x) is defined with figure data. For example, a Gaussian function can be used as the distribution function $g_{PS}(x)$. In addition, the convolution amount T may be calculated in the writing apparatus 100.

$$T(x) = \int \rho_{ps}(x')g_{ps}(x-x')dx' \quad (1)$$

A plurality of discrete dose latitudes DL(U,T) are input from the outside and stored, as parameters, in the storage device 144 (storage unit). The dose latitude DL(U,T) is defined as a coefficient that depends on a convolution amount T and a proximity effect density U and indicates a relation between a pattern dimension CD and a dose D of an electron beam. That is, the dose latitude DL(U,T) is a value variable when the convolution amount T changes even if the proximity effect density U does not change, or, alternatively, the dose latitude DL(U,T) is a value variable when the proximity effect density U changes even if the convolution amount T does not change. Here, a dose latitude DL(U,T) under a plurality of discrete conditions is obtained in advance by an experiment etc. by letting the convolution amount T and the proximity effect density U be variable.

Figure 4:
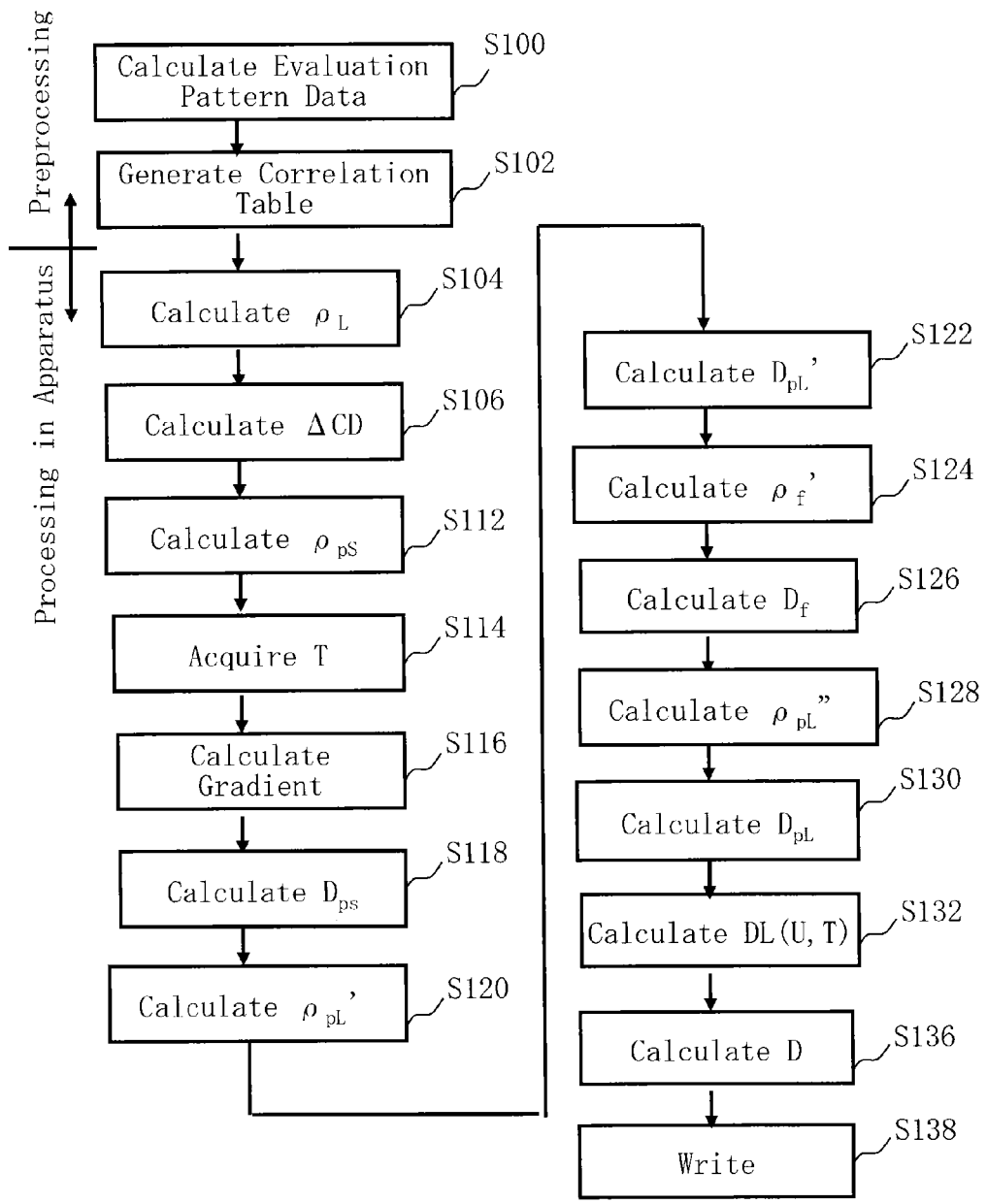
FIG. 4 is a flowchart showing main steps of a writing method according to Embodiment 1.

FIG. 4 is a flowchart showing main steps of a writing method according to Embodiment 1. As shown in FIG. 4, the writing method according to Embodiment 1 first executes, as preprocessing, an evaluation pattern data calculation step (S100) and a correlation table generation step (S102). Next, the writing method according to Embodiment 1 executes a series of steps: an area density $\rho_L$ calculation step (S104), a dimension variation amount ΔCD calculation step (S106), an area density $\rho_{pS}$ calculation step (S112), a convolution amount T acquisition step (S114), a gradient calculation step (S116), a small-influence-radius-phenomenon dose correction coefficient $D_{ps}$ calculation step (S118), a dose density $\rho_{pL}'$ calculation step (S120), a proximity effect dose correction coefficient $D_{pL}'$ calculation step (S122), a dose density $\rho_f'$ calculation step (S124), a fogging effect dose correction coefficient $D_f$ calculation step (S126), a dose density $\rho_{pL}''$ calculation step (S128), a proximity effect dose correction coefficient $D_{pL}$ calculation step (S130), a dose latitude DL(U,T) calculation step (S132), a dose D calculation step (S136), and a writing step (S138). It is also acceptable to re-perform the area dessity$\rho_{pS}$ calculation step (S112), the convolution amount T acquisition step (S114), the gradient calculation step (S116), and the small-influence-radius-phenomenon dose correction coefficient $D_{ps}$ calculation step (S118) between the fogging effect dose correction coefficient $D_f$ calculation step (S126) and the dose density $\rho_{pL}''$ calculation step (S128). By this, it becomes unnecessary, in the dose density $\rho_{pL}'$ calculation step (S120), to save the area density $\rho_{pS}$ and the small-influence-radius-phenomenon dose correction coefficient $D_{ps}$ until the dose density $\rho_{pL}''$ calculation step (S128) where they are to be used again after once being used, thereby reducing the volume of the storage device.

Similarly, it is also acceptable to re-perform the convolution amount T acquisition step (S114), the gradient calculation step (S116), and the small-influence-radius-phenomenon dose correction coefficient $D_{ps}$ calculation step (S118) between the proximity effect dose correction coefficient $D_{pL}$ calculation step (S130) and the dose D calculation step (S136). By this, it becomes unnecessary in the dose density $\rho_{pL}'$ calculation step (S120) to save the small-influence-radius-phenomenon dose correction coefficient $D_{ps}$ until the dose D calculation step (S136) where the coefficient $D_{ps}$ is to be used again after once being used, thereby reducing the volume of the storage device.

Although, in Embodiment 1, dimension variation due to a small influence radius phenomenon of the influence radius being several μm or less, dimension variation due to a proximity effect, dimension variation due to a fogging effect, and dimension variation due to a loading effect are all corrected, it is not limited thereto. For example, it is also acceptable to obtain a dose by which dimension variation due to a small influence radius phenomenon and dimension variation due to a proximity effect have been corrected. Thereby, the dimension variation due to the small influence radius phenomenon and the dimension variation due to a proximity effect can be corrected. That is, it is also acceptable to obtain a dose by which dimension variation due to a small influence radius phenomenon where the influence radius is several μm or less, and at least one of dimension variations due to a proximity effect, a fogging effect, and a loading effect have been corrected.

First, in the evaluation pattern data calculation step (S100) serving as preprocessing 1, evaluation pattern data is calculated by using an evaluation pattern.

Figure 5:
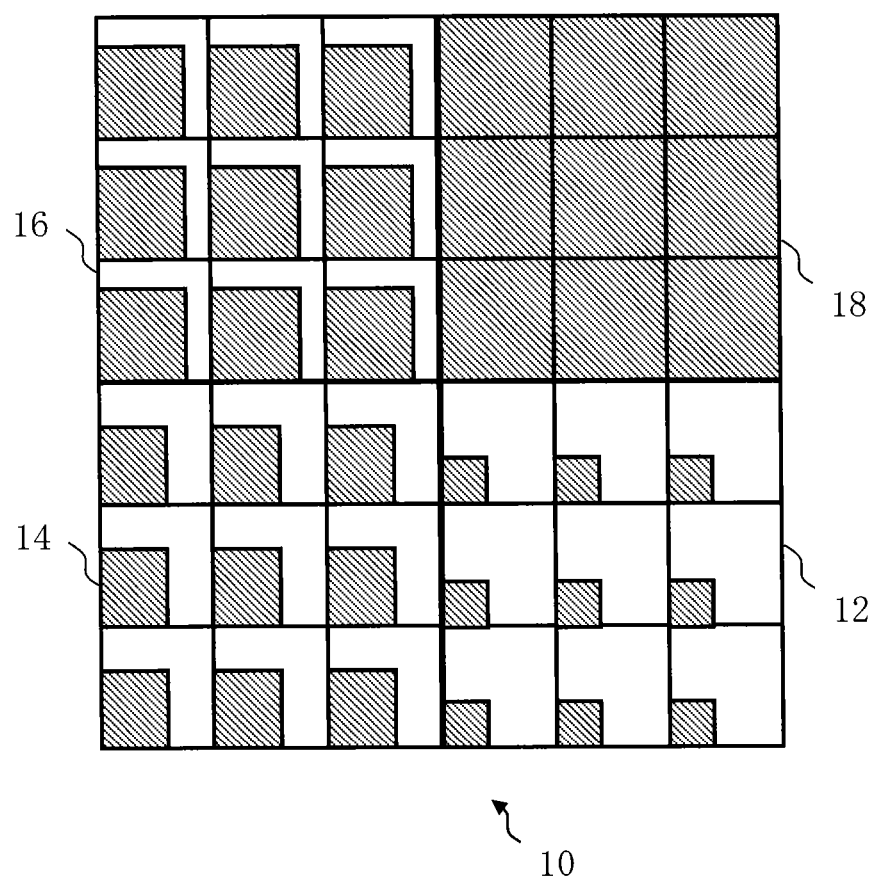
FIG. 5 shows an example of an evaluation pattern according to Embodiment 1.

FIG. 5 shows an example of an evaluation pattern according to Embodiment 1. In an evaluation pattern 10 in FIG. 5, there are, for example, four pattern regions whose area densities are different from each other. In this case, a pattern region 12 whose area density is 10%, a pattern region 14 whose area density is 30%, a pattern region 16 whose area density is 70%, and a pattern region 18 whose area density is 100% are formed. Each pattern region is divided into mesh regions of a predetermined size, and the area density of each mesh region is adjusted to be the one that has been set respectively. In the example of FIG. 5, although each pattern region is divided into nine (3×3) mesh regions, it is not limited thereto, and more mesh regions may be arranged. Using the evaluation pattern 10, a small-influence-radius-phenomenon dose correction coefficient $D_{ps}(x)$ and a convolution amount $T(x)$ of the area density of each mesh region are calculated. The convolution amount $T(x)$ can be obtained by solving the equation (1) described above. The small-influence-radius-phenomenon dose correction coefficient $D_{ps}(x)$ is defined by the following equation (2) by using a small-influence-radius-phenomenon correction coefficient $\eta_{ps}$ for correcting the small influence radius phenomenon, a proximity effect correction coefficient $\eta_{pL}$, an area density $\rho_{ps}(x)$ of each mesh region, and a distribution function $g_{ps}(x)$ described above. It is preferable for the size of a mesh region to be about 1/10 of an influence radius $\sigma_{ps}$ of the small influence radius phenomenon of the influence radius being several μm or less, and for example, to be about 100 to 500 nm.

$$\frac{D_{ps}(x)}{2} + \eta_{ps}\int D_{ps}(x')g_{ps}(x-x')\rho_{ps}(x')dx' = \frac{1}{2} + \eta_{ps} + \eta_{pL} \quad (2)$$

Next, a gradient of the convolution amount $T(x)$ in each mesh region is calculated. It is herein expressed as coordinates of a position x=(x,y). The gradient is obtained by calculating $\delta T(x,y)/\delta x$, being a partial differential in the x direction of $T(x,y)$, and $\delta T(x,y)/\delta y$, being a partial differential in the y direction of $T(x,y)$. As described above, $D_{ps}(x,y)$, $T(x,y)$, $\delta T(x,y)/\delta x$, and $\delta T(x,y)/\delta y$ are calculated as evaluation pattern data.

Next, in the correlation table generation step (S102) serving as preprocessing 2, a correlation table of $D_{ps}(x, y)$, $\delta T(x,y)/\delta x$, and $\delta T(x,y)/\delta y$ is generated for each convolution amount $T(x, y)$.

Figure 6:
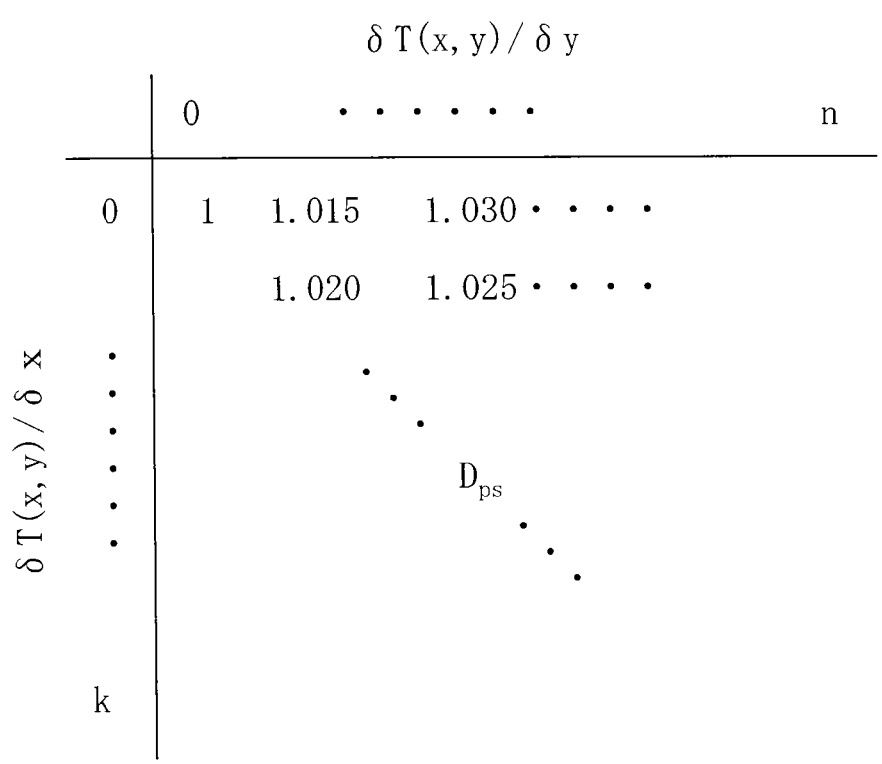
FIG. 6 shows an example of a correlation table according to Embodiment 1.

FIG. 6 shows an example of a correlation table according to Embodiment 1. FIG. 6 shows an example of a correlation table with respect to a certain convolution amount $T(x, y)$. In FIG. 6, the vertical axis represents $\delta T(x,y)/\delta x$, being a gradient in the x direction, and the horizontal axis represents $\delta T(x,y)/\delta y$, being a gradient in the y direction. Then, there is defined $D_{ps}(x,y)$ corresponding to both the gradient values in the x and y directions. However, the table value of the correlation table is not limited to $D_{ps}(x,y)$. For example, it is also acceptable to previously obtain $D_{ps}(x, y)$ whose gradient values in the x and y directions are both 0, and to define a ratio with respect to $D_{ps}(x,y)$ whose gradient values in the x and y directions are both 0, as each table value of the correlation table. Alternatively, it is also preferable to define a difference instead a ratio.

The correlation table having been generated for each convolution amount $T(x,y)$ is stored in the storage device 140. Next, each step is executed based on writing data where a pattern to be actually written in the writing apparatus 100 is defined. x is expressed as a vector, hereafter.

In the area density $\rho_L$ calculation step (S104), the area density $\rho_L$ calculation unit 41 (the first area density calculation unit) virtually divides the writing region of the target object 101 into a plurality of mesh regions of a predetermined size, and calculates an area density occupied by a figure pattern in each mesh region. The area density $\rho_L$ calculation unit 41 calculates an area density $\rho_L(x)$ for each mesh region of, for example, 1/10 of the size of the influence radius of a loading effect. It is preferable for a mesh size $\Delta_{L'}$ (the first mesh size) for calculating an area density $\rho_L(x)$ to be about 100-500 μm, for example.

In the dimension variation amount ΔCD calculation step (S106), the ΔCD calculation unit 40 calculates a dimension variation amount ΔCD(x) due to a loading effect, for each figure pattern defined in writing data. The ACID calculation unit 40 is an example of a dimension variation amount calculation unit. The dimension variation amount ΔCD(x) is defined by the following equation (3) by using a distribution function $g_L(x)$, the area density $\rho_L(x)$, a loading effect correction coefficient $\gamma$, and a position dependent dimension variation amount P(x). For example, it is preferable to use a Gaussian distribution function etc. as the distribution function $g_L(x)$. Moreover, it is preferable to use $\rho_L(x)$ described above as the area density $\rho_L(x)$. The calculated ΔCD(x) is temporarily stored in the storage device 142.

$$\Delta CD(x) = \gamma\int\rho_L(x')g_L(x-x')dx' + P(x) \quad (3)$$

In the area density $\rho_{pS}$ calculation step (S112), the area density $\rho_{pS}$ calculation unit 43 (the second area density calculation unit) virtually divides the writing region of the target object 101 into a plurality of mesh regions of a predetermined size, and calculates an area density $\rho_{pS}(x)$ occupied by a figure pattern in each mesh region. The area density $\rho_{pS}$ calculation unit 43 calculates an area density $\rho_{pS}(x)$ for each mesh region of, for example, 1/10 of the size of the influence radius of a phenomenon whose influence radius is several μm or less (for example, 1 to 5 μm), like the case of EUV short range proximity effect (short range PEC). It is preferable for a mesh size $\Delta_s$ (the second mesh size) for calculating an area density $\rho_{pS}(x)$ to be about 0.1 to 0.5 μm, for example.

In the convolution amount T acquisition step (S114), the convolution amount T acquisition unit 42 reads and acquires a convolution amount $T(x)$ for each figure pattern defined in writing data.

In the gradient calculation step (S116), the gradient calculation unit 44 calculates a gradient of each convolution amount $T(x)$ (convolution function) by using the acquired area density, convolution amount $T(x)$ of the distribution function, and a convolution amount $T(x)$ at a position around the convolution amount $T(x)$ concerned. The gradient calculation unit 44 is an example of a gradient calculation unit. In this case, it is expressed as coordinates of a position x=(x,y). The gradient is obtained by calculating $\delta T(x,y)/\delta x$, being a partial differential in the x direction of $T(x,y)$, and $\delta T(x,y)/\delta y$, being a partial differential in the y direction of $T(x,y)$.

In the small-influence-radius-phenomenon dose correction coefficient $D_{ps}$ calculation step (S118), the $D_{ps}$ calculation unit 46 calculates a small-influence-radius-phenomenon dose correction coefficient $D_{ps}$ that corrects for dimension variation due to a phenomenon whose influence radius is on the order of microns or less by using the convolution amount T(x,y), the x direction partial differential δT(x,y)/δx, and the y direction partial differential δT(x,y)/δy. The $D_{ps}$ calculation unit 46 is an example of a small-influence-radius-phenomenon dose correction coefficient calculation unit or a phenomenon dose correction coefficient calculation unit. Specifically, the $D_{ps}$ calculation unit 46 reads a correlation table from the storage device 140, and acquires a small-influence-radius-phenomenon dose correction coefficient $D_{ps}(x,y)$ which correlates with the convolution amount T(x,y), the x direction partial differential δT(x,y)/δx, and the y direction partial differential δT(x,y)/δy. The small-influence-radius-phenomenon dose correction coefficient $D_{ps}(x,y)$ is an example of a phenomenon dose correction coefficient. By the method described above, it is possible to acquire $D_{ps}(x,y)$ which can correct for dimension variation due to a phenomenon whose influence radius is on the order of microns or less. The calculated $D_{ps}(x,y)$ is temporarily stored in the storage device 142. x is expressed as a vector, hereafter.

In the dose density $\rho_{pL}'$ calculation step (S120), the $\rho_{pL}'$ calculation unit 53 (the first dose density calculation unit) calculates a dose density $\rho_{pL}'(x)$ (the first dose density). The dose density $\rho_{pL}'(x)$ is defined by the following equation (4) by using a small-influence-radius-phenomenon dose correction coefficient $D_{ps}(x)$, an area density $\rho_{pS}(x)$, a mesh size $\Delta_s$, and a mesh size $\Delta_L$. The mesh size $\Delta_L$ (the third mesh size) shall be larger than a mesh size $\Delta_{pL}$ (the fifth mesh size) which is originally for proximity effect correction. It is preferable for the mesh size $\Delta_L$ to be 5 to 10 µm, for example. Although in this case, $\rho_{pL}'(x)$ is referred to as a dose density, since this is just a term referred to for convenience, other reference term may also be acceptable. That is, it may be merely referred to as a function $\rho_{pL}'(x)$.

$$\rho_{pL}'(x) = \sum_i D_{pS}(x_i)\rho_{pS}(x_i)\frac{\Delta_S^2}{\Delta_L^2} \quad (4)$$

In the proximity effect dose correction coefficient $D_{pL}'(x)$ calculation step (S122), the $D_{pL}'(x)$ calculation unit 51 (the second proximity effect dose correction coefficient calculation unit) calculates a proximity effect dose correction coefficient $D_{pL}'(x)$ (the second proximity effect dose correction coefficient) that corrects a dose so that dimension variation due to a proximity effect may be corrected, and is to be used for fogging effect correction calculation, by using a function $\rho_{pL}'(x)$ depending on $D_{ps}(x)$. $D_{pL}'(x)$ is defined by the following equation (5) by using $\rho_{pL}'(x)$, a distribution function $g_{PL}(x)$, a small-influence-radius-phenomenon correction coefficient $\eta_{ps}$, and a proximity effect correction coefficient $\eta_{pL}$.

$$D_{pL}'(x) + \frac{\eta_{pL}}{\frac{1}{2} + \eta_{pS} + \eta_{pL}}\int D_{pL}'(x')g_{pL}(x-x')\rho_{pL}'(x')dx' = 1 \quad (5)$$

As for the distribution function $g_{pL}(x)$, it is preferable to use a Gaussian distribution function, for example. Moreover, the calculation processing time for the second term $\rho_{pL}'(x)$ in the equation (5) can be shortened by using the obtained function $\rho_{pL}'(x)$. In this case, to perform fogging effect correction calculation, the mesh size $\Delta_L$ is set to be larger than the mesh size $\Delta_{pL}$ which is originally for proximity effect correction, thereby reducing the number of times of calculation and shortening the calculation processing time. By the method described above, it is possible to acquire $D_{pL}'(x)$ that can correct for dimension variation due to a proximity effect while correcting for dimension variation due to a phenomenon whose influence radius is on the order of microns or less.

In the dose density $\rho_f'$ calculation step (S124), the $\rho_f'$ calculation unit 57 (the second dose density calculation unit) calculates a dose density $\rho_f'(x)$ (the second dose density). The dose density $\rho_f'(x)$ is defined by the following equation (6) by using the proximity effect dose correction coefficient $D_{pL}'(x)$ for fogging effect correction calculation, the dose density $\rho_{pL}'(x)$, the mesh size $\Delta_f$, and the mesh size $\Delta_L$. It is preferable for the mesh size $\Delta_f$ (the fourth mesh size) to be, for example, 1/10 of the influence radius of a fogging effect, and for example, to be about 100 to 500 µm. Although in this case, $\rho_f'(x)$ is referred to as a dose density, since this is just a term referred to for convenience, other reference term may also be acceptable. That is, it may be merely referred to as a function $\rho_f'(x)$.

$$\rho_f'(x) = \sum_i D_{pL}'(x_i)\rho_{pL}'(x_i)\frac{\Delta_L^2}{\Delta_f^2} \quad (6)$$

The calculation processing time of the $\rho_{pL}'(x)$ in the equation (6) can be shortened by using the calculated function $\rho_{pL}(x)$.

In the fogging effect dose correction coefficient $D_f$ calculation step (S126), the $D_f$ calculation unit 52 calculates a fogging effect dose correction coefficient $D_f(x)$ that corrects a dose so that dimension variation due to a fogging effect may be corrected, by using a function $\rho_f'(x)$ (the second function) which depends on $D_{ps}(x)$. The $D_f$ calculation unit 52 is an example of a fogging effect dose correction coefficient calculation unit. $D_f(x)$ is defined by the following equation (7) by using $\rho_f'(x)$, a small-influence-radius-phenomenon correction coefficient $\eta_{pS}$, a proximity effect correction coefficient $\eta_{pL}$, a distribution function $g_f(x)$ and a fogging effect correction coefficient θ.

$$D_f(x) + \frac{\theta}{\frac{1}{2} + \eta_{pS} + \eta_{pL}}\int D_f(x')g_f(x-x')\rho_f'(x')dx' = 1 \quad (7)$$

As for the distribution function $g_f(x)$, it is preferable to use a Gaussian distribution function, etc., for example. By the method described above, it is possible to acquire $D_f(x)$ that can correct for dimension variation due to a proximity effect and further due to a fogging while correcting for dimension variation due to a phenomenon whose influence radius is on the order of microns or less.

In the dose density $\rho_{pL}''$ calculation step (S128), the $\rho_{pL}''$ calculation unit 55 (the third dose density calculation unit) calculates a dose density $\rho_{pL}''(x)$ (the third dose density). The dose density $\rho_{pL}''(x)$ is defined by the following equation (8) by using a small-influence-radius-phenomenon dose correction coefficient $D_{ps}(x)$, an area density $\rho_{pS}(x)$, a mesh size $\Delta_s$, and a mesh size $\Delta_{pL}$. It is preferable for the mesh size $\Delta_{pL}$ (the fifth mesh size) to be, for example, 1/10 of the influence radius of a proximity effect, and for example, to be about 1 µm. Although in this case, $\rho_{pL}''(x)$ is referred to as a dose density, since this is just a term referred to for convenience, other reference term may also be acceptable. That is, it may be merely referred to as a function $\rho_{pL}''(x)$. In addition, as described above, in order to obtain an area density $\rho_{pS}(x)$ and a small-influence-radius-phenomenon dose correction coefficient $D_{ps}(x)$ which are used for calculating the dose density $\rho_{pL}''$ calculation step (S128), it is also preferable to re-perform the area density $\rho_{pS}$ calculation step (S112), the convolution amount T acquisition step (S114), the gradient calculation step (S116), and the small-influence-radius-phenomenon dose correction coefficient $D_{ps}$ calculation step (S118).

$$\rho_{pL}''(x) = \sum_i D_{pS}(x_i)\rho_{pS}(x_i)\frac{\Delta_S^2}{\Delta_{pL}^2} \quad (8)$$

In the proximity effect dose correction coefficient $D_{pL}(x)$ calculation step (S130), the $D_{pL}(x)$ calculation unit 50 (the first proximity effect dose correction coefficient calculation unit) calculates a proximity effect dose correction coefficient $D_{pL}(x)$ (the first proximity effect dose correction coefficient calculation unit) which corrects for dimension variation due to an original proximity effect, by using a function $\rho_{pL}''(x)$ (the first function) depending on $D_{pS}(x)$. $D_{pL}(x)$ is defined by the following equation (9) by using $\rho_{pL}''(x)$, a distribution function $g_{pL}(x)$, a small-influence-radius-phenomenon correction coefficient $\eta_{ps}$, and a proximity effect correction coefficient $\eta_{pL}$.

$$D_{pL}(x) + \frac{\eta_{pL}}{\frac{1}{2} + \eta_{pS} + \eta_{pL}} \int D_{pL}(x')g_{pL}(x-x')\rho_{pL}''(x')dx' = 1 \quad (9)$$

As for the distribution function $g_{pL}(x)$, it is preferable to use a Gaussian distribution function, etc., for example. By the method described above, it is possible to acquire $D_{pL}(x)$ that can correct for dimension variation due to a proximity effect while correcting for dimension variation due to a phenomenon whose influence radius is on the order of microns or less.

In the dose latitude DL(U,T) calculation step (S132), the DL (U,T) calculation unit 54 calculates a dose latitude DL (U,T) that is a coefficient indicating a relation between a pattern dimension L and a dose D of an electron beam and varies depending on a convolution amount T and a proximity effect density U, by using the convolution amount T and the proximity effect density U. The DL(U,T) calculation unit 54 is an example of a dose latitude calculation unit.

Figure 7:
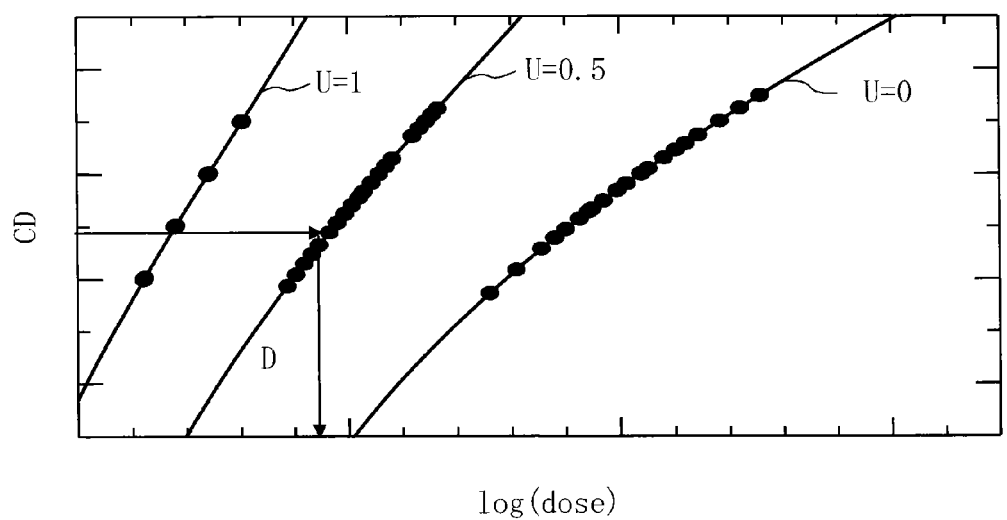
FIG. 7 is a graph showing an example of a correlation data with respect to a pattern dimension CD and a dose D according to Embodiment 1.

FIG. 7 is a graph showing an example of a correlation data with respect to a pattern dimension CD and a dose D according to Embodiment 1. The vertical axis represents a pattern dimension CD, and the horizontal axis represents a dose D in logarithm. Here, the cases of a proximity effect density U(x) being 0 (0%), 0.5 (50%), and 1 (100%), for example, are respectively obtained based on an experiment. Since the case of the proximity effect density U(x)=0 means there is no pattern in fact, an approximation is performed to obtain the proximity effect density U(x) by writing one measurement line pattern, for example, in the state there is nothing around it. On the contrary, in the case of the proximity effect density U(x)=1, since it is impossible to measure the dimensions because the whole inside of the mesh including the circumference configures a pattern, an approximation is performed to obtain the proximity effect density U(x) by writing one measurement line pattern, for example, in the state where the whole circumference is filled with the pattern. Here, setting of the proximity effect density U(x) is not limited to 0%, 50%, and 100%. For example, it is preferable to set three densities of one being 10% or less, one being 50%, and one being 90% or more. Moreover, it is not limited to three densities, and other number of densities may also be acceptable. For example, four or more densities may be used. The dose latitude DL(U,T) indicates the gradient of the graph, for example. In the case of writing a pattern on a usual photo mask using a transmitted light, it does not depend on a convolution amount T, but in the case of writing a pattern on an EUV mask, there occurs a phenomenon whose influence radius is several μm or less, like the case of an EUV short range proximity effect (short range PEC). Therefore, the dose latitude DL(U,T) depends on a convolution amount T. Thus, even when a proximity effect density U(x) is constant, the dose latitude DL(U,T) changes depending on a convolution amount T. Then, according to Embodiment 1, a plurality of discrete dose latitudes DL(U,T) which depend on a convolution amount T and a proximity effect density U are calculated in advance by an experiment etc. by using an evaluation pattern, and stored in the storage device 144.

The DL(U,T) calculation unit 54 can obtain continuous DL(U,T) by reading data of a plurality of discrete DL(U,T) from the storage device 144 and performing fitting of them. The proximity effect density U(x) is defined by a value obtained by convolving a pattern area density $\rho_p(x)$ in a proximity effect with a distribution function $g_p(x)$, in the range larger than or equal to the influence range $\sigma_p$ of the proximity effect. It is preferable for a proximity effect mesh to be, for example, about 1/10 of the influence radius $\sigma_p$ of the proximity effect described above, and to be about 1 μm, for example.

In the dose D calculation step (S136), the D calculation unit 56 calculates a dose D(x) by using a proximity effect dose correction coefficient $D_{pL}(x)$ and a small-influence-radius-phenomenon dose correction coefficient $D_{ps}(x)$. The D calculation unit 56 is an example of a dose calculation unit. According to Embodiment 1, the dose D(x) is further calculated using a fogging effect dose correction coefficient $D_f(x)$. Moreover, according to Embodiment 1, the dose D(x) is further calculated using a dose latitude DL(U,T) and a dimension variation amount ΔCD due to a loading effect. The dose D(x) is defined by the following equation (10) by using a base dose $D_{base}$, $D_{pL}(x)$, $D_{ps}(x)$, $D_f(x)$, DL(U,T), and ΔCD(x). As described above, it is also preferable to re-perform the convolution amount T acquisition step (S114), the gradient calculation step (S116), and the small-influence-radius-phenomenon dose correction coefficient $D_{ps}$ calculation step (S118) in order to obtain a small-influence-radius-phenomenon dose correction coefficient $D_{ps}(x)$ for performing calculation in the dose D calculation step (S136).

$$D(x) = D_{base}D_{pS}(x)D_{pL}(x)D_f(x)\exp\left(\frac{-\Delta CD(x)}{DL(U,T)}\right) \quad (10)$$

By calculating a dose based on the equation (10), it is possible to correct for dimension variation due to a proximity effect, a fogging effect, and a loading effect while correcting for dimension variation due to a phenomenon whose influence radius is several μm or less, like the case of an EUV short range proximity effect (short range PEC). In the case of correcting for dimension variation due to a proximity effect while correcting for dimension variation due to a phenomenon whose influence radius is several μm or less, like the case of an EUV short range PEC, without correcting for dimension variation due to a fogging effect and a loading effect, it does not need to use $D_f(x)$, DL (U,T), and $\Delta CD(x)$. In the case of correcting for dimension variation due to a proximity effect and a fogging effect while correcting for dimension variation due to a phenomenon whose influence radius is several μm or less, like the case of an EUV short range PEC, without correcting for dimension variation due to a loading effect, it does not need to use DL(U,T) and $\Delta CD(x)$. In the case of correcting for dimension variation due to a proximity effect and a loading effect while correcting for dimension variation due to a phenomenon whose influence radius is several μm or less, like the case of an EUV short range PEC, without correcting for dimension variation due to a fogging effect, it does not need to use $D_f(x)$. Thus, what is necessary is just to adjust the equation to be in accordance with the contents to be corrected. In any of the cases, it is possible to correct for dimension variation due to a phenomenon whose influence radius is several μm or less, like the case that the EUV short range PEC. The calculated dose D(x) is stored in the storage device 146. It is preferable for the dose D(x) to be stored as data converted to an irradiation time t by the irradiation time calculation unit 58. The irradiation time t can be obtained by dividing a dose D(x) by a current density J.

On the other hand, in parallel to the processing of calculating the dose, the shot data generation unit 58 inputs writing data from the storage device 140, performs data conversion processing of plural steps, and generates apparatus-specific shot data. The shot data generation unit 58 converts a plurality of figure patterns defined in the writing data into shot figures each having a shapeable size to be irradiated by one shot of the electron beam 200, and generates shot data in which an irradiation position of each shot figure, a type of a shot figure, a size of a shot figure, etc. are defined. The shot data is stored in the storage device 146.

In the writing step (S138), under the control of the writing control unit 62, first, the deflection control circuit 130 reads dose D(x) data from the storage device 146, irradiates each shot figure with the electron beam 200 of a dose (irradiation time) defined for each shot figure, and calculates a deflection amount for deflecting the electron beam 200 to be blocked when the irradiation time t has passed. Then, a deflection voltage of the calculated deflection amount is applied to a corresponding blanking deflector 212 through the DAC amplifier 132. Moreover, the deflection control circuit 130 calculates a deflection amount for deflecting the electron beam 200 to a defined writing position in accordance with the shot data. Similarly, the deflection control circuit 130 calculates a deflection amount for shaping a figure to be a type and a size defined for each shot figure. Then, a deflection voltage of each deflection amount is applied to corresponding deflectors 205 and 208 through a DAC amplifier (not shown). Under the control of the writing control unit 62, the writing unit 150 writes a figure pattern concerned on the target object 101 by using the electron beam 200 based on the calculated dose D(x). Specifically, the following operations are performed.

When passing through the blanking deflector 212, the electron beam 200 emitted from the electron gun assembly 201 (emission unit) is controlled by the blanking deflector 212 to pass through the blanking aperture 214 when the beam is in the ON state, and is deflected so that the entire beam may be blocked by the blanking aperture 214 when the beam is in the OFF state. The electron beam 200 passing through the blanking aperture 214 while changing the state from beam OFF to beam ON and lastly again to beam-OFF serves as one shot of the electron beam. The blanking deflector 212 controls the direction of passing electron beam 200 to alternately generate the beam ON state and the beam OFF state. For example, it is acceptable to apply a voltage to the blanking deflector 212 when in the beam OFF state and not to apply a voltage when in the beam ON state. The dose per shot of the electron beam 200 to irradiate the target object 101 is adjusted depending upon an irradiation time t of each shot.

As described above, each shot of the electron beam 200, generated by passing through the blanking deflector 212 and the blanking aperture 214, irradiates the whole of the first shaping aperture 203, which has a quadrangular opening, by the illumination lens 202. Here, the electron beam 200 is first shaped to be a quadrangle. Then, after having passed through the first shaping aperture 203, the electron beam 200 of a first aperture image is projected onto the second shaping aperture 206 by the projection lens 204. The first aperture image on the second shaping aperture 206 is deflection-controlled by the deflector 205 so as to change the shape and size of the beam (variable shaping). Such variable beam shaping is performed for each shot, and, usually, each of the shots is shaped to have a different shape and size. Then, after having passed through the second shaping aperture 206, the electron beam 200 of a second aperture image is focused by the objective lens 207, and deflected by the deflector 208 to reach a desired position on the target object 101 placed on the XY stage 105 which moves continuously. Since the XY stage 105 is moving, the deflector 208 deflects the electron beam 200 such that it follows the movement of the XY stage 105.

According to Embodiment 1 as described above, it is possible to correct for dimension variation due to a phenomenon whose influence radius is several μm or less, namely further less than the influence radius of a proximity effect, like the case of an EUV short range PEC, while correcting dimension variation due to other variation factors, such as a proximity effect. Accordingly, highly precise writing can be performed.

Embodiment 2

In Embodiment 1, there has been described the case of calculating a dose for correcting a loading effect by using a parameter different from that for correcting a proximity effect. In Embodiment 2, there will be described a case of using a combination of a base dose $D_{base}$ and a proximity effect correction coefficient q, wherein the base dose $D_{base}$ corrects for a dimension variation amount due to a loading effect, for each position of the substrate while correcting for a proximity effect. The contents of Embodiment 2, other than those specifically described below, are the same as those of Embodiment 1.

Figure 8:
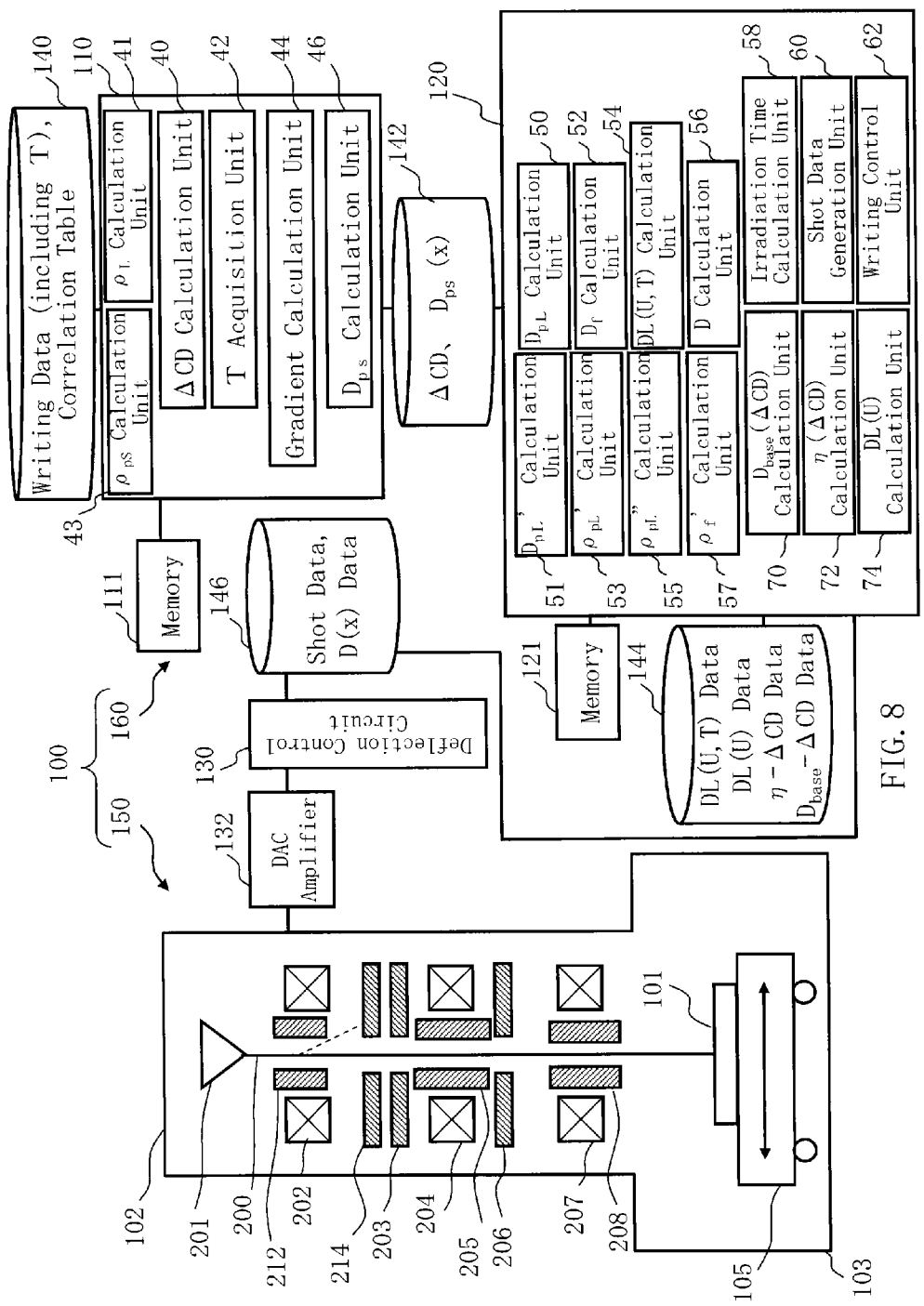
FIG. 8 is a schematic diagram showing a configuration of a writing apparatus according to Embodiment 2.

FIG. 8 is a schematic diagram showing a configuration of the writing apparatus according to Embodiment 2. FIG. 8 is the same as FIG. 1 except for the addition of a base dose $D_{base}(\Delta CD)$ calculation unit 70, a proximity effect correction coefficient $\eta(\Delta CD)$ calculation unit 72, and a dose latitude DL(U) calculation unit 74 in the control computer 120. Similarly to other functions in the control computer 120, the base dose $D_{base}(\Delta CD)$ calculation unit 70, the proximity effect correction coefficient $\eta(\Delta CD)$ calculation unit 72, and the dose latitude DL(U) calculation unit 74 may be configured by software such as a program, or may be configured by hardware such as an electronic circuit. Alternatively, they may be configured by a combination of software and hardware. Input data necessary for the control computer 120 and a calculated result are stored in the memory 121 each time.

Figure 9:
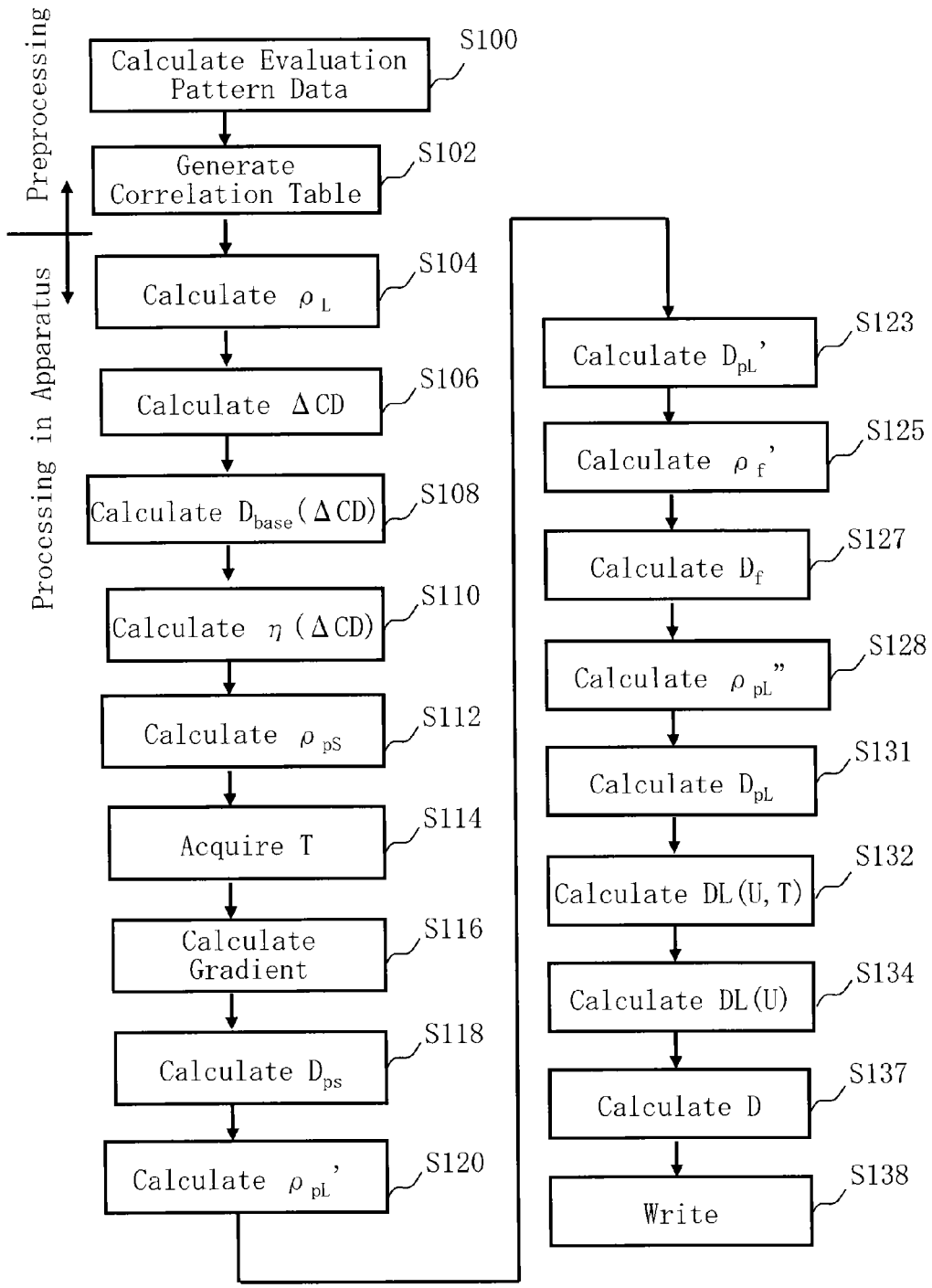
FIG. 9 is a flowchart showing main steps of a writing method according to Embodiment 2.
Figure 10:
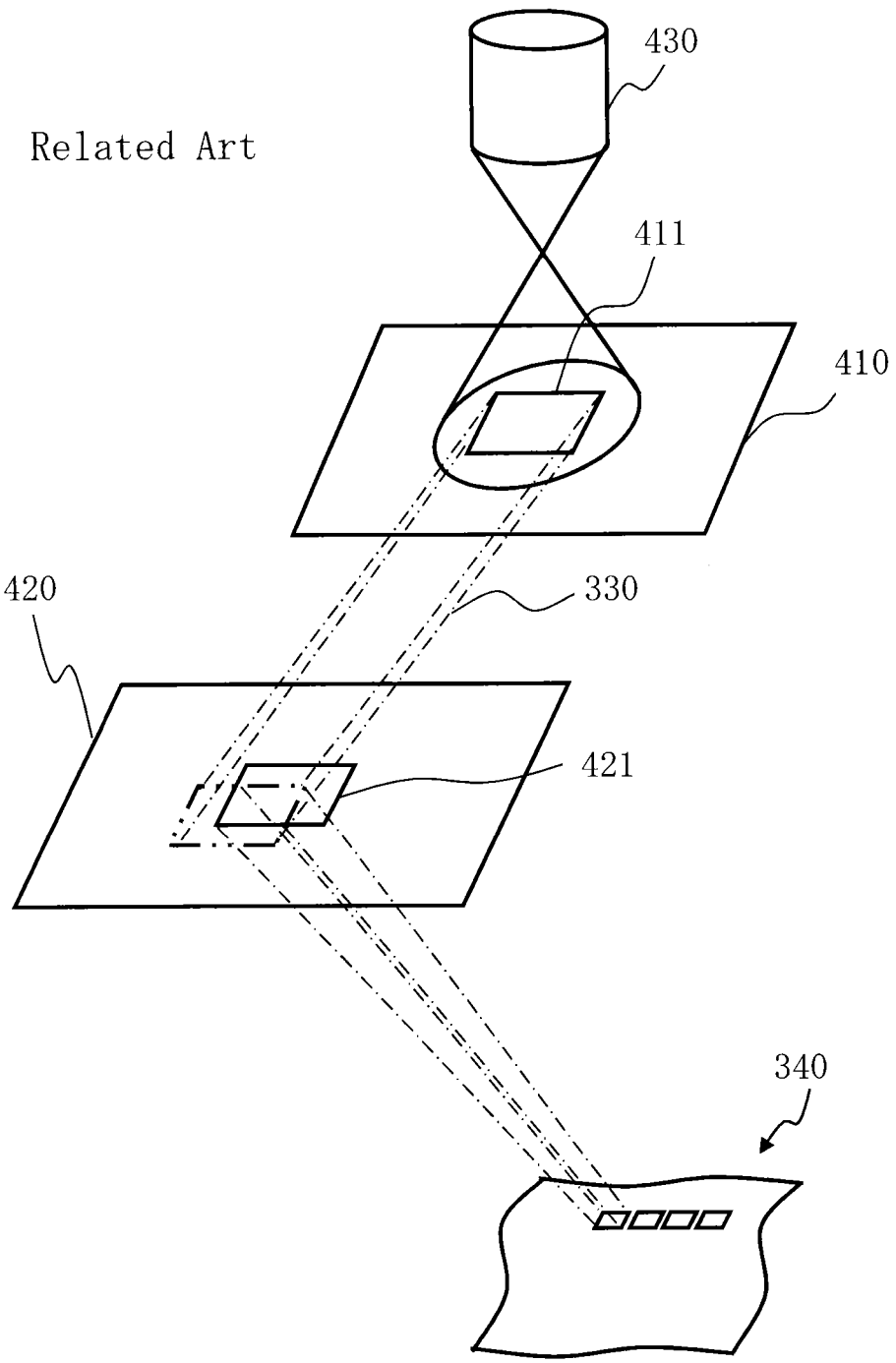
FIG. 10 is a schematic diagram explaining operations of a variable shaped electron beam writing apparatus.

FIG. 9 is a flowchart showing main steps of the writing method according to Embodiment 2. The writing method according to Embodiment 2 shown in FIG. 9 is the same as FIG. 4 except for the following: a base dose $D_{base}(\Delta CD)$ calculation step (S108), and a proximity effect correction coefficient η(ΔCD) calculation step (S110) are added after the ΔCD calculation step (S106), a dose latitude DL(U) calculation step (S134) is added after the dose latitude DL(U,T) calculation step (S132), a proximity effect dose correction coefficient $D_{pL}'$ calculation step (S123) is added instead of the proximity effect dose correction coefficient $D_{pL}'$ calculation step (S122), a dose density $\rho_f'$ calculation step (S125) is added instead of the dose density $\rho_f'$ calculation step (S124), a fogging effect dose correction coefficient $D_f$ calculation step (S127) is added instead of the fogging effect dose correction coefficient $D_f$ calculation step (S126), a proximity effect dose correction coefficient $D_{pL}$ calculation step (S131) is added instead of the proximity effect dose correction coefficient $D_{pL}$ calculation step (S130), and a dose D calculation step (S137) is added instead of the dose D calculation step (S136).

It is similar to Embodiment 1 in that, the area density $\rho_{pS}$ calculation step (S112), the convolution amount T acquisition step (S114), the gradient calculation step (S116), and the small-influence-radius-phenomenon dose correction coefficient $D_{ps}$ calculation step (S118) may be re-performed between the fogging effect dose correction coefficient $D_f$ calculation step (S127) and the dose density $\rho_{pL}''$ calculation step (S128).

It is also similar to Embodiment 1 in that, the convolution amount T acquisition step (S114), the gradient calculation step (S116), and the small-influence-radius-phenomenon dose correction coefficient $D_{ps}$ calculation step (S118) may be re-performed between the proximity effect dose correction coefficient $D_{pL}$ calculation step (S131) and the dose D calculation step (S137).

Similarly to Embodiment 1, a plurality of discrete dose latitudes DL(U,T) are input into the storage device 144 from the outside as parameters, and stored therein. According to Embodiment 2, in addition to the above, a plurality of discrete dose latitudes DL(U) are input from the outside as parameters and stored therein. The dose latitude DL(U) is defined as a coefficient that indicates a relation between a pattern dimension CD and a dose D of and an electron beam, depending on the proximity effect density U. In other words, as long as the same proximity effect density U is used, the value of the dose latitude DL(U) does not change even if the convolution amount T changes. For obtained by using an evaluation pattern written on a photo mask, etc. For example, the cases of a proximity effect density U(x) being 0 (0%), 0.5 (50%), and 1 (100%) are respectively obtained based on an experiment. The dose latitude DL (U) represents the gradient of the graph of the correlation data relating to the pattern dimension CD and the dose D, for example. By this, a plurality of discrete dose latitudes DL (U), each of which does not depend on a convolution amount T but depends on a proximity effect density U, can be obtained. A plurality of discrete dose latitudes DL(U) are stored in the storage device 144.

Further, correlation data between a dimension variation amount ΔCD which is due to a loading effect and a base dose $D_{base}$ which can correct the dimension variation amount ΔCD simultaneously while correcting for a proximity effect is stored in the storage device 144. Similarly, correlation data between a dimension variation amount ΔCD which is due to a loading effect and a proximity effect correction coefficient $\eta_{pL}$ which can correct the dimension variation amount ΔCD while correcting for a proximity effect is stored. Here, there is a proximity effect correction coefficient $\eta_{pL}$ which is suitable for performing proximity effect correction, for each base dose $D_{base}$.

Then, a dimension variation amount ΔCD is made to be variable in advance before writing, and, for each dimension variation amount ΔCD, the correlation data described above is obtained by experiment in advance. Thus, data of a base dose $D_{base}$ (ΔCD) depending on a dimension variation amount ΔCD due to a loading effect and data of a proximity effect correction coefficient $\eta_{pL}$(ΔCD) also depending on the dimension variation amount ΔCD are stored in the storage device 144.

According to Embodiment 2, the contents of each step from the evaluation pattern data calculation step (S100) to the ΔCD calculation step (S106) are the same as those in Embodiment 1.

In the base dose $D_{base}$(ΔCD) calculation step (S108), the $D_{base}$(ΔCD) calculation unit 70 reads ΔCD(x) from the storage device 144, and calculates a base dose $D_{base}$(LCD) by using the ΔCD(x).

In the proximity effect correction coefficient η(ΔCD) calculation step (S110), the η(ΔCD) calculation unit 72 reads ΔCD(x) from the storage device 144, and calculates a proximity effect correction coefficient $\eta_{pL}$(ΔCD) by using the ΔCD(x).

By the method described above, it is possible to acquire a combination of a base dose $D_{base}$(ΔCD) that can correct for a dimension variation amount ΔCD simultaneously while correcting for a proximity effect and a proximity effect correction coefficient η(ΔCD). The contents of each step from the area density $\rho_{pS}$ calculation step (S112) to the dose density $\rho_{pL}'$ calculation step (S120) are the same as those in Embodiment 1.

In the proximity effect dose correction coefficient $D_{pL}'$ calculation step (S123), the $D_{pL}'(x)$ calculation unit 51 calculates a proximity effect dose correction coefficient $D_{pL}'(x)$ that corrects a dose so that dimension variation due to a proximity effect may be corrected, to be used for fogging effect correction calculation, by using a function $\rho_{pL}'(x)$ depending on $D_{ps}(x)$. $D_{pL}'(x)$ is defined by the following equation (11) by using $\rho_{pL}'(x)$, a distribution function $g_{PL}(x)$, a small-influence-radius-phenomenon correction coefficient $\eta_{ps}$, and a proximity effect correction coefficient $\eta_{pL}$(ΔCD).

$$D_{pL}'(x) + \frac{\eta_{pL}(\Delta CD)}{\frac{1}{2} + \eta_{pS} + \eta_{pL}(\Delta CD)} \int D_{pL}'(x') g_{pL}(x - x') \rho_{pL}'(x') dx' = 1 \quad (11)$$

By the method described above, it is possible to acquire $D_{PL}'(x)$ for fogging effect calculation, which can correct for dimension variation due to a proximity effect while correcting for dimension variation due to a phenomenon whose influence radius is several μm or less, like the case of an EUV short range PEC. Moreover, a loading effect is corrected simultaneously. However, with respect to correction of a loading effect, if this state is kept, there remains an error due to a phenomenon whose influence radius is several μm or less, like the case of an EUV short range PEC, and therefore, such error will be corrected later.

In the dose density $\rho_f'$ calculation step (S125), the $\rho_f'$ calculation unit 57 calculates a dose density $\rho_f'(x)$. The dose density $\rho_f'(x)$ is defined by the following equation (12) by using a base dose $D_{base}$, a base dose $D_{base}$(ΔCD), a proximity effect dose correction coefficient $D_{pL}'(x)$ for fogging effect correction calculation, a dose density $\rho_{pL}'(x)$, a mesh size $\Delta_f$, and a mesh size $\Delta_L$.

$$\rho'_f(x) = \frac{D_{base}(\Delta CD)}{D_{base}} \sum_i D'_{pL}(x_i)\rho'_{pL}(x_i)\frac{\Delta_L^2}{\Delta_f^2} \quad (12)$$

The calculation processing time for $\rho_{pL}'(x)$ in the equation (12) can be shortened by using the function $\rho_{pL}'(x)$ which has already been obtained.

In the fogging effect dose correction coefficient $D_f$ calculation step (S127), the $D_f$ calculation unit 52 calculates a fogging effect dose correction coefficient $D_f(x)$ that corrects for dimension variation due to a fogging effect by using a function $\rho_f'(x)$ depending on $D_{ps}(x)$. The $D_f$ calculation unit 52 is an example of the fogging effect dose correction coefficient calculation unit. $D_f(x)$ is defined by the following equation (13) by using $\rho_f'(x)$, a small-influence-radius-phenomenon correction coefficient $\eta_{pS}$, a proximity effect correction coefficient $\eta_{pL}$, a distribution function $g_f(x)$ and a fogging effect correction coefficient $\theta$.

$$D_f(x) + \frac{\theta}{\frac{1}{2} + \eta_{pS} + \eta_{pL}} \int D_f(x')g_f(x-x')\rho_f'(x')dx' = 1 \quad (13)$$

By the method described above, it is possible to acquire $D_f(x)$ that can correct for dimension variation due to a proximity effect and further a fogging effect while correcting for dimension variation due to a phenomenon whose influence radius is on the order of microns or less. Moreover, a loading effect is corrected simultaneously. However, with respect to correction of a loading effect, if this state is kept, there remains an error due to a forward scattering, and thereby such error will be corrected later. The dose density $\rho_{pL}''$ calculation step (S128) is the same as that in Embodiment 1.

In the proximity effect dose correction coefficient $D_{pL}(x)$ calculation step (S131), the $D_{pL}(x)$ calculation unit 50 calculates a proximity effect dose correction coefficient $D_{pL}(x)$ that corrects for dimension variation due to an original proximity effect, by using a function $\rho_{pL}''(x)$ depending on $D_{ps}(x)$. $D_{pL}(x)$ is defined by the following equation (14) by using $\rho_{pL}''(x)$, a distribution function $g_{PL}(x)$, a small-influence-radius-phenomenon correction coefficient $\eta_{ps}$, and a proximity effect correction coefficient $\eta_{pL}(\Delta CD)$.

$$D_{pL}(x) + \frac{\eta_{pL}(\Delta CD)}{\frac{1}{2} + \eta_{pS} + \eta_{pL}(\Delta CD)} \int D_{pL}(x')g_{pL}(x-x')\rho_{pL}''(x')dx' = 1 \quad (14)$$

As for the distribution function $g_{PL}(x)$, it is preferable to use a Gaussian distribution function, etc., for example. By the method described above, $D_{pL}(x)$ that can correct for dimension variation due to a proximity effect while correcting for dimension variation due to a phenomenon whose influence radius is on the order of microns or less can be acquired.

In the dose latitude DL(U,T) calculation step (S132), a dose latitude DL(U,T) (the first dose latitude) is calculated. The contents of the dose latitude DL(U,T) calculation step (S132) are the same as those in Embodiment 1. The DL(U,T) calculation unit 54 is an example of the first dose latitude calculation unit. Further, according to Embodiment 2, the dose latitude DL(U) calculation step (S134) is executed as described above.

In the dose latitude DL(U) calculation step (S134), by using a proximity effect density U(x), the DL(U) calculation unit 74 calculates a dose latitude DL(U) (the second dose latitude) which is a coefficient indicating a relation between a pattern dimension L and a dose D of an electron beam, does not vary depending on a convolution amount T as long as the same proximity effect density U(x) is used, and varies depending on the proximity effect density U(x). The DL(U) calculation unit 54 is an example of the second dose latitude calculation unit. The DL(U) calculation unit 74 can obtain continuous DL(U) by reading data of a plurality of discrete DL(U) from the storage device 144 and performing fitting of them.

In the dose D calculation step (S137), the dose D calculation unit 56 calculates a dose D(x) by using a dose latitude DL(U, T), a dose latitude DL (U), and a dimension variation amount $\Delta CD(x)$ due to a loading effect. The dose D(x) is defined by the following equation (15) by using a base dose $D_{base}(\Delta CD)$, $D_{pS}(x)$, $D_{pL}(x)$, $D_f(x)$, DL(U,T), DL(U), and $\Delta CD(x)$. Moreover, as described above, it is also preferable to re-perform the convolution amount T acquisition step (S114), the gradient calculation step (S116), and the small-influence-radius-phenomenon dose correction coefficient $D_{ps}$ calculation step (S118) in order to acquire a small-influence-radius-phenomenon dose correction coefficient $D_{ps}(x)$ used for calculating the dose D calculation step (S137).

$$D(x) = D_{base}(\Delta CD(x))D_{pS}(x)D_{pL}(x)D_f(x)\exp\left(\frac{-\Delta CD(x)}{DL(U,T)}\right) \Big/ \exp\left(\frac{-\Delta CD(x)}{DL(U)}\right) \quad (15)$$

By calculating a dose based on the equation (15), for example, it is possible to correct for dimension variation due to a proximity effect, a fogging effect, and a loading effect while correcting for dimension variation due to a phenomenon whose influence radius is several μm or less, namely less than the influence radius of a proximity effect, like the case of an EUV short range PEC. For example, in the case of correcting for dimension variation due to a proximity effect and a loading effect while correcting for dimension variation due to a phenomenon whose influence radius is several μm or less, namely less than the influence radius of a proximity effect, like the case of an EUV short range PEC, without correcting for dimension variation due to a fogging effect, it does not need to use $D_f(x)$. Thus, what is necessary is just to adjust the equation suitably to be in accordance with the contents to be corrected. According to Embodiment 2, loading effect correction is performed by using $D_{base}(\Delta CD)$ and $\eta_{pL}(\Delta CD)$. However, if this state is kept, there remains an error due to a phenomenon whose influence radius is several μm or less, and therefore, such error is corrected in the term using DL(U,T), DL(U), and $\Delta CD(x)$.

According to Embodiment 2 as described above, even when $D_{base}(\Delta CD)$ depending on $\Delta CD$ and $\eta_{pL}(\Delta CD)$ are used, it is possible to correct for dimension variation due to a phenomenon whose influence radius is several μm or less, namely further less than the influence radius of a proximity effect, like the case of an EUV short range PEC, while correcting for dimension variation due to other variation factors, such as a proximity effect. Accordingly, highly precise writing can be performed.

Embodiment has been explained referring to concrete examples described above. However, the present invention is not limited to these specific examples. According to Embodiment 1, the $\Delta CD$ calculation step (S106) is arranged between the $\rho_L$ calculation step (S104) and the $\rho_{pS}$ calculation step (S112), but, it is not limited thereto. What is required for the ΔCD calculation step (S106) is to be completed by the time of starting the D calculation step (S136). Similarly, what is required for the DL(U,T) calculation step (S132) is to be completed by the time of starting the time D calculation step (S136). Moreover, in Embodiment 2, as for the $D_{base}(\Delta CD)$ calculation step (S108) and the proximity effect correction coefficient η(ΔCD) calculation step (S110), whichever may be performed first. Alternatively, they may be performed in parallel. What is required for the ΔCD calculation step (S106) is to be completed by the time of start of either earlier one of the $D_{base}(\Delta CD)$ calculation step (S108) and the η(ΔCD) calculation steps (S110). Moreover, as for the DL(U,T) calculation step (S132) and the DL(U) calculation step (S134), whichever may be performed first. Alternatively, they may be performed in parallel. What is required for the DL(U,T) calculation step (S132) and the DL(U) calculation step (S134) is to be completed by the time of starting the D calculation step (S137).

The ΔCD calculation step (S106) may be calculated beforehand outside of the writing apparatus 100. T may be calculated in the writing apparatus 100 instead of the T acquisition step (S114).

While the apparatus configuration, control method, etc. not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing apparatus and a method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing apparatus comprising:
    a gradient calculation unit configured to calculate a gradient of a convolution amount that is calculated from a convolution operation between an area density and a distribution function;
    a small influence radius phenomenon dose correction coefficient calculation unit configured to calculate a small influence radius phenomenon dose correction coefficient that corrects for dimension variation due to a phenomenon whose influence radius is on an order of microns or less, by using the convolution amount and the gradient;
    a first proximity effect dose correction coefficient calculation unit configured to calculate a first proximity effect dose correction coefficient that corrects for dimension variation due to a proximity effect, by using a first function depending on the small influence radius phenomenon dose correction coefficient;
    a dose calculation unit configured to calculate a dose by using the first proximity effect dose correction coefficient and the small influence radius phenomenon dose correction coefficient; and
    a writing unit configured to write a figure pattern concerned on a target object, based on the dose, by using a charged particle beam.

2. The apparatus according to claim 1, further comprising:
    a fogging effect dose correction coefficient calculation unit configured to calculate a fogging effect dose correction coefficient that corrects for dimension variation due to a fogging effect, by using a second function depending on the small influence radius phenomenon dose correction coefficient,
    wherein the dose calculation unit further calculates the dose by using the fogging effect dose correction coefficient.

3. The apparatus according to claim 1, further comprising:
    a dimension variation amount calculation unit configured to calculate a dimension variation amount due to a loading effect; and
    a dose latitude calculation unit configured to calculate, by using the convolution amount and a proximity effect density, a dose latitude that is a coefficient indicating a relation between a pattern dimension and a dose of the charged particle beam and that varies depending on the convolution amount and the proximity effect density,
    wherein the dose calculation unit further calculates the dose by using the dose latitude and a dimension variation amount due to a loading effect.

4. The apparatus according to claim 1, further comprising:
    a first dose latitude calculation unit configured to calculate, by using the convolution amount and a proximity effect density, a first dose latitude that is a coefficient indicating a relation between a pattern dimension and a dose of the charged particle beam and that depends on the convolution amount and the proximity effect density; and
    a second dose latitude calculation unit configured to calculate, by using the proximity effect, a second dose latitude that is a coefficient indicating a relation between a pattern dimension and a dose of the charged particle beam, and that does not vary depending on the convolution amount in a case of a same proximity effect density but varies depending on the proximity effect density,
    wherein the dose calculation unit further calculates the dose by using the first dose latitude, the second dose latitude, and a dimension variation amount due to a loading effect.

5. The apparatus according to claim 1, further comprising:
    a storage unit configured to store a plurality of discrete does latitudes input from outside as parameters.

6. The apparatus according to claim 1, further comprising:
    a first area density calculation unit configured to calculate a first area density occupied by a figure pattern, for each of a first mesh region made by virtually dividing a writing region of the target object into a plurality of first mesh regions each having a first mesh size smaller than an influence radius of a loading effect.

7. The apparatus according to claim 6, further comprising:
    a second area density calculation unit configured to calculate a second area density occupied by a figure pattern, for each of a second mesh region made by virtually dividing the writing region of the target object into a plurality of second mesh regions each having a second mesh size smaller than the first mesh size and smaller than an influence radius of a phenomenon whose influence radius is 5 μm or less.

8. The apparatus according to claim 1, further comprising:
    a convolution amount acquisition unit configured to acquire the convolution amount obtained by performing the convolution operation between the area density and the distribution function, for each figure pattern.

9. The apparatus according to claim 7, further comprising:
a first dose density calculation unit configured to calculate a first dose density by using the small influence radius phenomenon dose correction coefficient, the second area density, the second mesh size, and a third mesh size smaller than the first mesh size and larger than the second mesh size.

10. The apparatus according to claim 9, further comprising:
a second proximity effect dose correction coefficient calculation unit configured to calculate a second proximity effect dose correction coefficient that corrects for dimension variation due to a proximity effect to be used for fogging effect correction calculation, by using the first dose density depending on the small influence radius phenomenon dose correction coefficient.

11. The apparatus according to claim 10, further comprising:
a second dose density calculation unit configured to calculate a second dose density, by using the second proximity effect dose correction coefficient, the first dose density, the third mesh size, and a fourth mesh size larger than the second mesh size.

12. The apparatus according to claim 11, further comprising:
a third dose density calculation unit configured to calculate a third dose density, by using the small influence radius phenomenon dose correction coefficient, the second area density, the second mesh size, and a fifth mesh size larger than the second mesh size and smaller than the third mesh size.

13. The apparatus according to claim 12, wherein the third dose density is used as the first function.

14. A charged particle beam writing method comprising:
calculating a gradient of a convolution amount that is calculated from a convolution operation between an area density and a distribution function;
calculating a small influence radius phenomenon dose correction coefficient that corrects for dimension variation due to a phenomenon whose influence radius is on an order of microns or less, by using the convolution amount and the gradient;
calculating a first proximity effect dose correction coefficient that corrects for dimension variation due to a proximity effect, by using a first function depending on the small influence radius phenomenon dose correction coefficient;
calculating a dose by using the first proximity effect dose correction coefficient and the small influence radius phenomenon dose correction coefficient; and
writing a figure pattern concerned on a target object, based on the dose, by using a charged particle beam.

15. The method according to claim 14, further comprising:
calculating a fogging effect dose correction coefficient that corrects for dimension variation due to a fogging effect, by using a second function depending on the small influence radius phenomenon dose correction coefficient,
wherein the dose is further calculated by using the fogging effect dose correction coefficient.

* * * * *